(12) United States Patent
Larson et al.

(10) Patent No.: US 7,142,125 B2
(45) Date of Patent: Nov. 28, 2006

(54) FAN MONITORING FOR FAILURE PREDICTION

(75) Inventors: Thane M. Larson, Roseville, CA (US); Christopher G. Malone, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 11/042,910

(22) Filed: Jan. 24, 2005

(65) Prior Publication Data

US 2006/0176186 A1    Aug. 10, 2006

(51) Int. Cl.
*G08B 21/00*    (2006.01)
*H02K 1/00*    (2006.01)
*H02K 9/00*    (2006.01)
*H02H 5/04*    (2006.01)
*F04B 17/00*    (2006.01)
*F04B 49/00*    (2006.01)

(52) U.S. Cl. ...................... 340/635; 340/648; 340/679; 310/52; 310/53; 310/54; 310/55; 310/56; 310/57; 310/58; 318/434; 318/538; 318/539; 318/540; 318/541; 318/542; 361/23; 361/30; 361/31; 417/16; 417/32; 417/42; 417/423.1; 417/423.7

(58) Field of Classification Search ................ 340/635, 340/648, 679; 310/52–58; 318/434, 538–542; 361/23–31; 417/16, 32, 42, 423.7
See application file for complete search history.

(56) References Cited

U.S. PATENT DOCUMENTS

| 5,412,303 | A | * | 5/1995 | Wernicki | .................... | 318/729 |
| 5,534,854 | A | * | 7/1996 | Bradbury et al. | ........... | 340/648 |
| 5,675,480 | A |   | 10/1997 | Stanford | | |
| 5,727,928 | A | * | 3/1998 | Brown | .................... | 417/44.11 |
| 5,831,405 | A | * | 11/1998 | Massie | ........................ | 318/471 |
| 6,262,549 | B1 | * | 7/2001 | Yang et al. | ................. | 318/463 |
| 6,956,344 | B1 | * | 10/2005 | Robertson et al. | .......... | 318/538 |
| 2004/0201279 | A1 |   | 10/2004 | Templeton | | |

* cited by examiner

*Primary Examiner*—Daniel Wu
*Assistant Examiner*—Lam Pham

(57) ABSTRACT

A method for monitoring a fan comprises measuring power usage of the fan, determining a derivative of the measured fan power usage, tracking the derivative over time, and predicting impending fan failure based on the tracked fan power usage derivative.

22 Claims, 9 Drawing Sheets

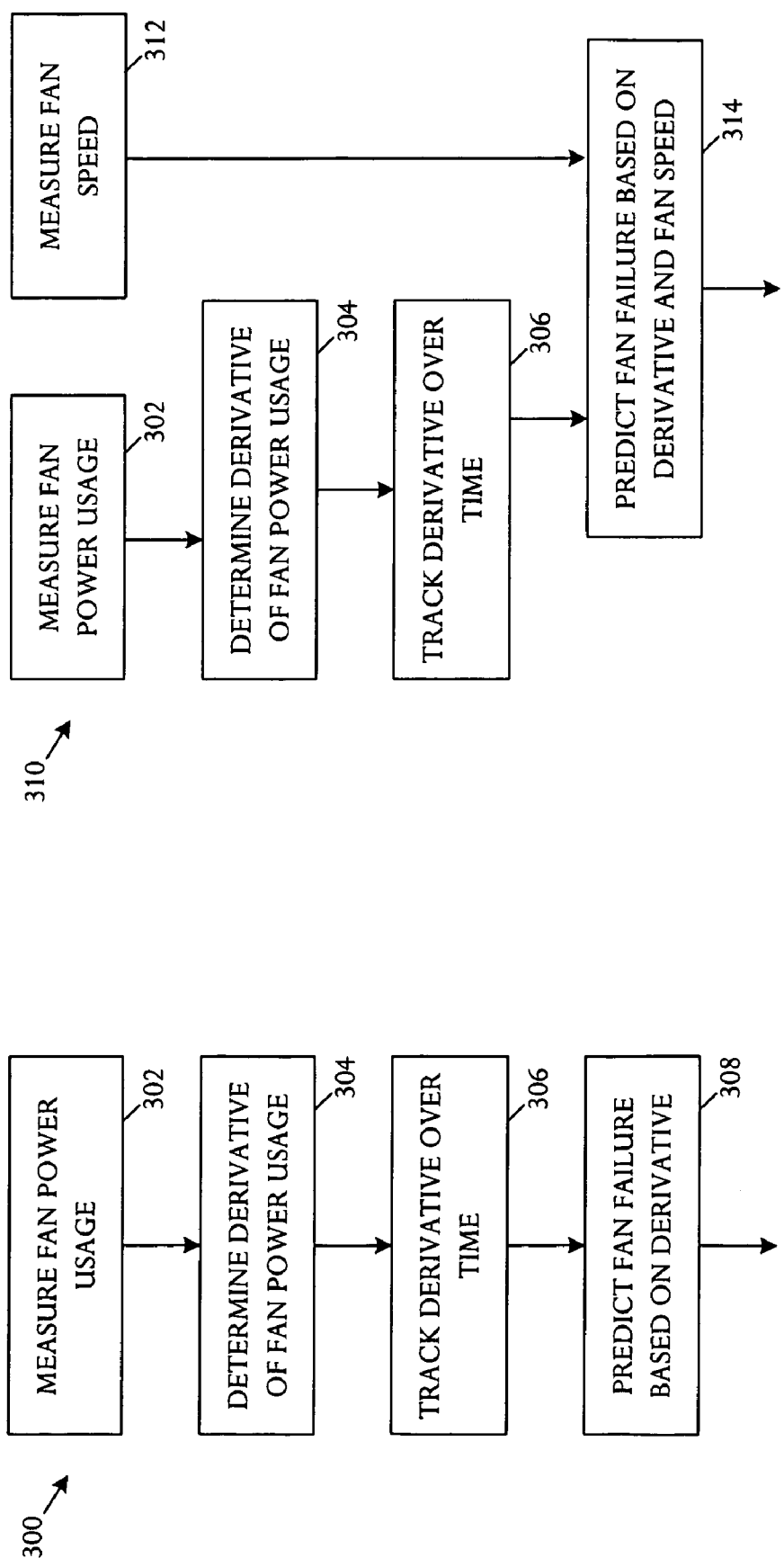

FAN MONITORING FOR FAILURE PREDICTION

BACKGROUND OF THE INVENTION

Fans are a relatively low reliability component in a power supply system. Failure of one or more fans in a fan array may cause an entire power supply system to fail due to overheating. Conventionally, fans are often replaced at regular maintenance intervals to avoid fan failure, sometimes replacing good fans and increasing maintenance costs while failing to replace fans that fail at a rate higher than expected.

In highly available system, an ability to hot-swap and cold-swap failed field replaceable units (FRUs) is common and useful. However, a maintenance schedule that depends on waiting until a FRU fails subjects a user to down-time and possible damage upon occurrence of a random failure event. Accordingly, many systems use hot-swap FRUs, enabling the system to continue to run during failure and repair. However, many or most fan failures occur due to wearing or aging and, although a first failing fan may be replaced, other redundant fans are also likely to be near end-of-life.

SUMMARY

In accordance with an embodiment of an electronic system, a method for monitoring a fan comprises measuring power usage of the fan, determining a derivative of the measured fan power usage, tracking the derivative over time, and predicting impending fan failure based on the tracked fan power usage derivative.

BRIEF DESCRIPTION OF THE DRAWINGS

Embodiments of the invention relating to both structure and method of operation, may best be understood by referring to the following description and accompanying drawings:

FIGS. 3A and 3B are flow charts showing embodiments of methods for monitoring a fan in an electronic system;

DETAILED DESCRIPTION

A fan monitoring device and operating method predict an impending fan failure and enable a customer or user to schedule repair events at a convenient time and setting. In some embodiments, a response to detected impending failure may be automatic, without user action. The fan monitoring device includes a circuit adapted to measure power or current usage of a fan and a control element adapted to perform a failure prediction method or technique.

Figure 1B:
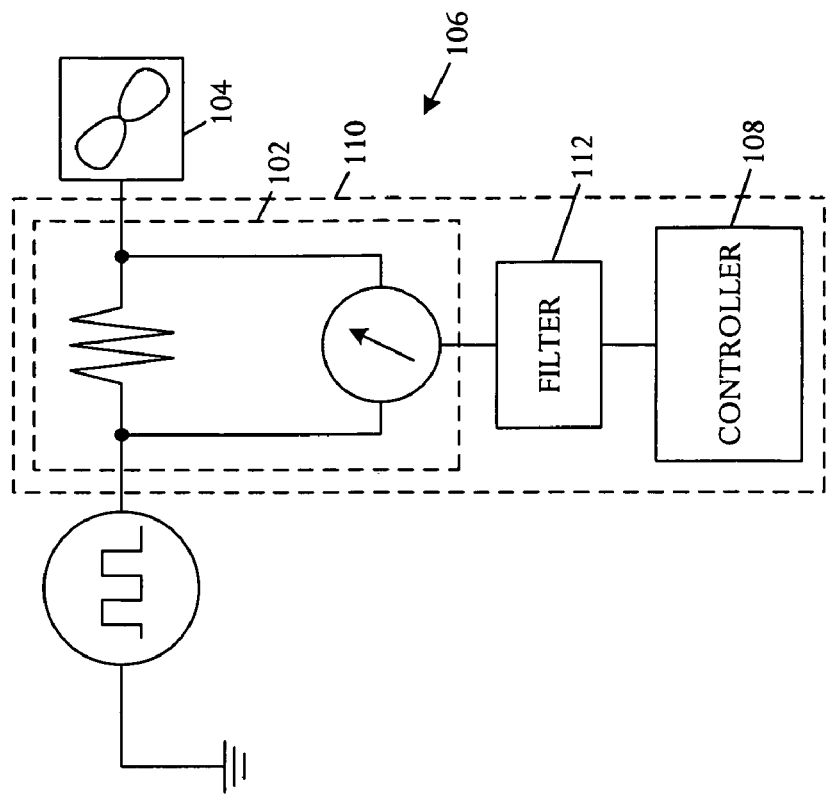
FIGS. 1A, 1B, and 1C are schematic block diagrams illustrating various embodiments of a fan condition monitoring apparatus.
Figure 1A:
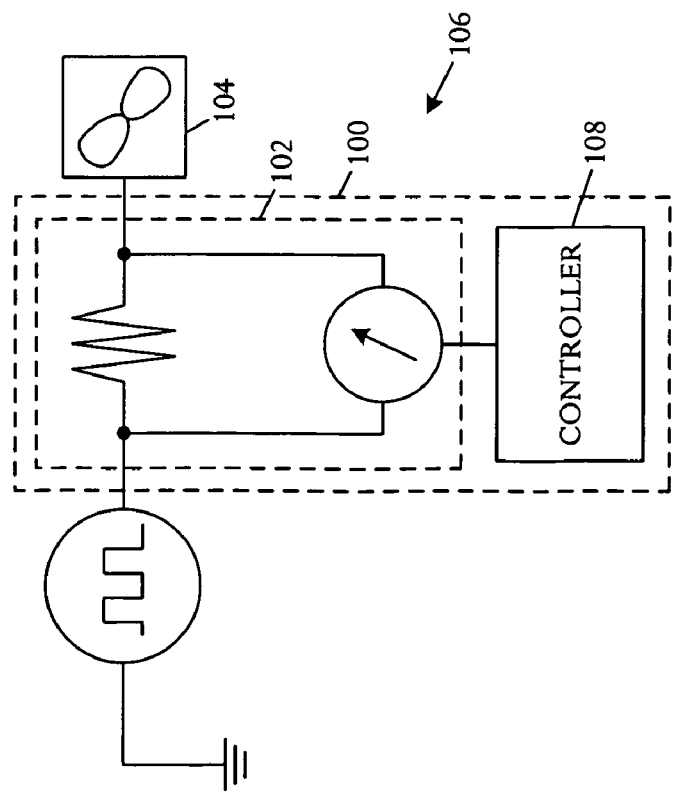

Referring to FIG. 1A, a schematic block diagram illustrates an embodiment of a fan condition monitoring apparatus 100. A power sensor 102 is adapted for coupling to at least one fan 104 in an electronic system 106 and measures fan power usage. The monitoring apparatus 100 further includes a controller 108 coupled to the power sensor 102 and adapted to determine a derivative of the measured fan power usage, track the derivative over time, and predict impending fan failure based on the tracked fan power usage derivative.

In a particular example, the power sensor 102 is adapted to measure fan current usage and the controller 108 computes a derivative of fan current usage and records a record of the fan current measurements over time.

The fan condition monitoring apparatus 100 tracks current consumption in the fan or fans 104 in addition to the rate of change of current usage over time. The controller 108 can measure absolute current consumption or changes in current over time and compare the current parameter with a mathematic model to predict when the fan 104 may be come incapable of performing adequately. Parameters derived from power or current measurements are more sensitive indicia of fan condition than fan speed.

In a typical embodiment, the power sensor 102 includes a small precision resistor coupled to a pulse power source that supplies the fan 104. The fan is typically driven by pulse modulation. However a Direct Current (DC) fan may be used in some systems. The power sensor 102 reads voltage across the resistor, for example by tapping the resistor in series.

In some embodiments, the precision resistor may be part of the power source, along with other components, so that the power sensor 102 may be implemented with little additional circuitry.

Referring to FIG. 1B, a schematic block diagram illustrates an embodiment of a monitoring apparatus 110 further comprising a filter 112 operational in combination with the controller 108. The filter 112 taps off the resistor in series to acquire an average voltage that is proportional to current.

The filter 112 may be implemented as an analog filter or a digital filter. The current measurement enables usage of analog filters that can have a smaller level of tolerance than a digital filter.

In the various embodiments, the controller 108 monitors the fan current derivative to detect an increase meeting a predefined criterion and indicating impending fan failure. For example, the controller 108 may monitor to detect an increase in fan current derivative exceeding a predefined threshold increase which defines a fan failure condition. The particular predefined threshold value depends on characteristics of a particular implementation. Variations in circuit implementations may result in signals with differing amounts of noise or variability. In a particular example, a delta current increase of 5%, 10%, 15%, or any other suitable value may be highly indicative of impending fan failure. Variations in delta current are typically gradual, correlating with the gradual nature of fan wearing, aging, or degradation. The gradual changes in fan performance and condition result from changes in component materials such as lubricants and bearings.

The controller 108 may monitor to detect more rapid changes in fan condition. For example, the controller may also monitor for a substantially stair-step increase in fan current or fan current derivative that exceeds a predefined threshold. The more sudden change in condition may indicate an immediate impending fan failure, for example a structural failure such as breaking of a rotor or complete seizure of bearing within the fan.

Figure 1C:
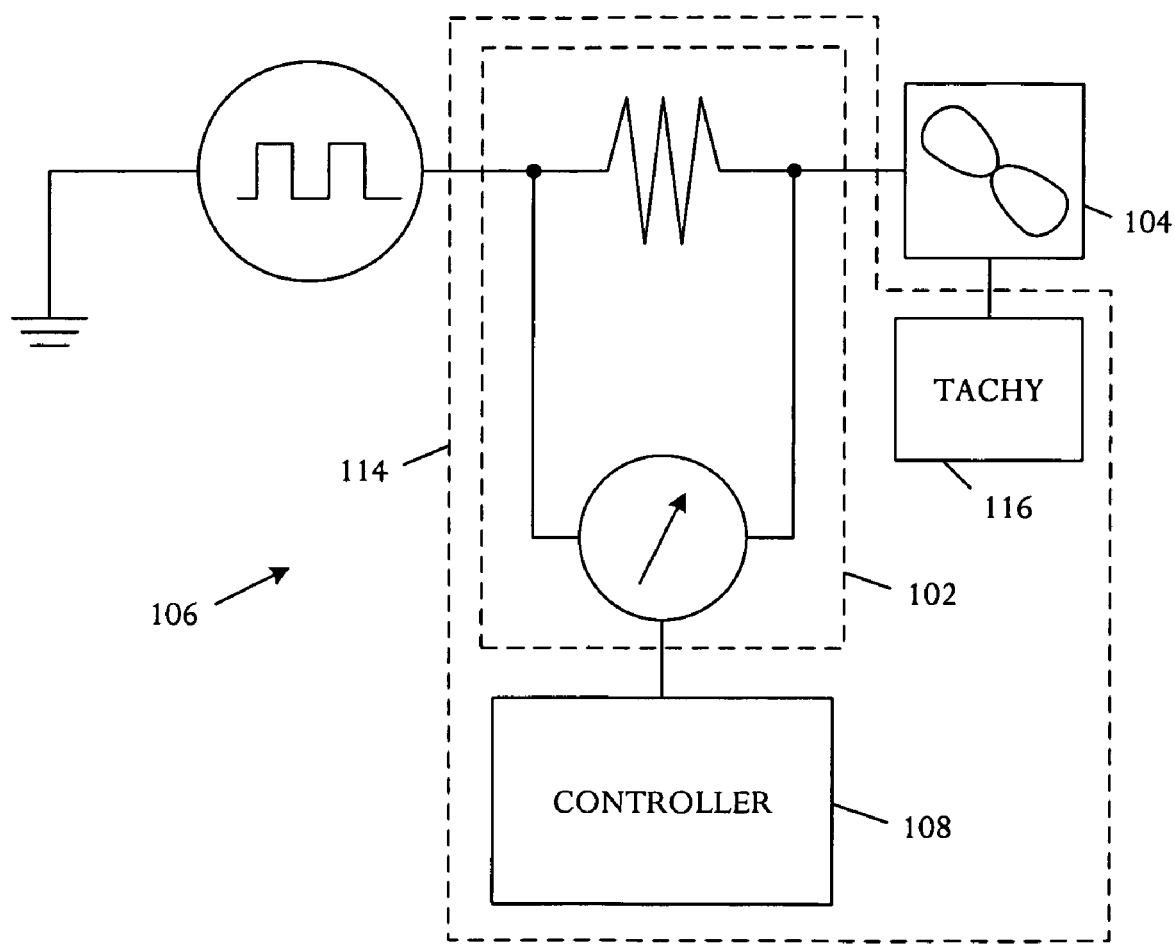

Referring to FIG. 1C, a schematic block diagram depicts an embodiment of a fan condition monitoring apparatus 114 that further performs actions including monitoring of fan speed. The fan condition monitoring apparatus 114 further comprises a tachometer 116 coupled to the controller 108. The tachometer 116 measures fan speed concurrently with power usage measurement. The controller 108 predicts impending fan failure based on the tracked fan power usage derivative and the fan speed in combination.

In the various embodiments, the controller 108 may be programmed to predict the expected time before a fan failure occurs based on the tracked fan power usage derivative.

The fan condition monitoring apparatus 114 uses the tachometer 116 to sense fan wear at a first level of sensitivity and uses the power sensor 102 to measure current consumption and sense fan wear at a higher level of sensitivity. Both fan speed and current supplied to the fan are naturally predictive measures of fan condition.

The fan speed measurement may be used in combination with the current measurement, for example to ensure that the fan 104 runs at least at a minimum selected speed and to set a base operating level that may be variable from fan to fan.

Figure 2:
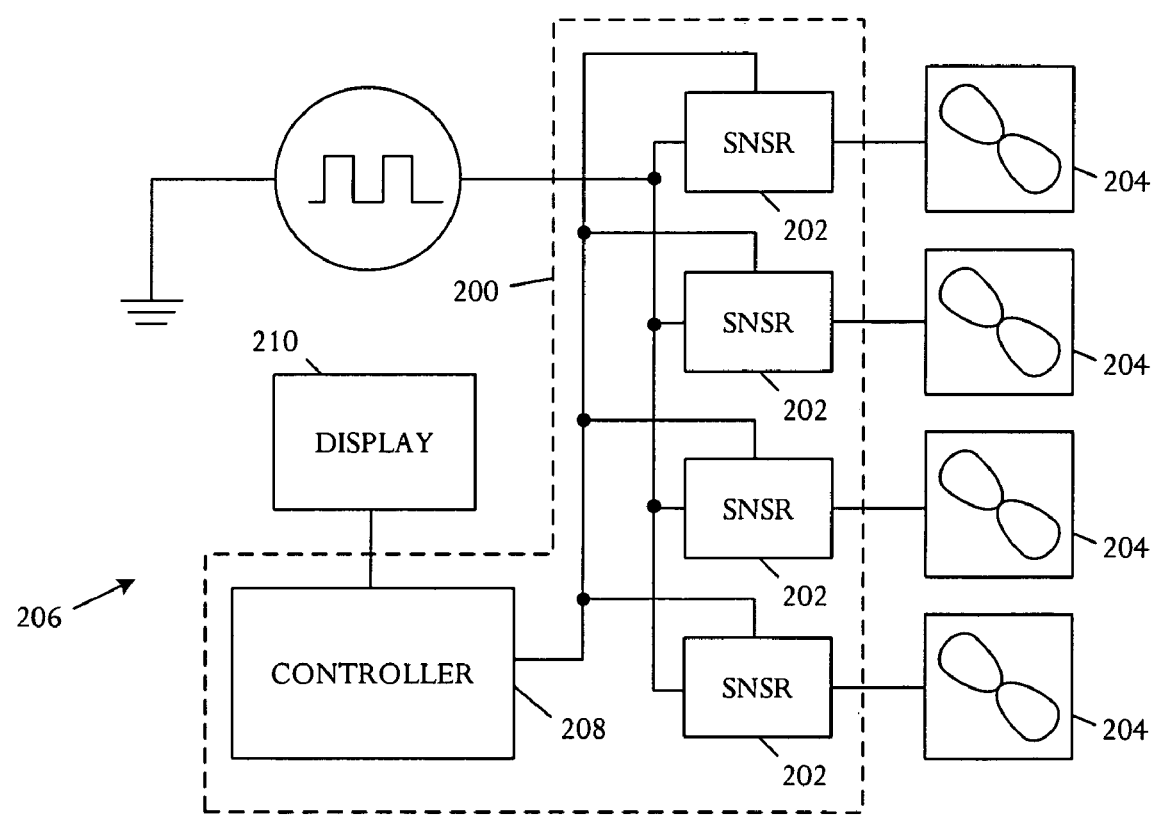
FIG. 2 is a schematic block diagram depicting an embodiment of a fan condition monitoring apparatus with multiple power sensors respectively coupled to corresponding fans.

Referring to FIG. 2, a schematic block diagram depicts an embodiment of a fan condition monitoring apparatus 200 with multiple power sensors 202 respectively coupled to corresponding fans 204. The power sensors 202 measure fan power or current usage. The power sensors 202 are connected to a controller 208 that monitors a tracked fan power usage derivative for the multiple fans 204, for usage in detecting the relative condition of the fans 204.

In some applications and/or embodiments, the controller 208 selectively sets fan speed individually for the multiple fans 204 with fans in a relatively higher condition run at a higher fan speed and fans in a relatively lower condition fans run at a lower fan speed. The controller 208 may monitor the tracked fan power usage derivatives for the multiple fans 204 and detect the relative condition of the fans 204. The electronic system 206 may further include a display 210 communicatively coupled to the controller 208. The controller 208 and display 210 can show an image of relative and/or absolute condition of the multiple fans 204, typically in response to a request by a user.

Referring to FIG. 3A, a flow chart depicts an embodiment of a method 300 for monitoring a fan in an electronic system. As a fan wears, typically due to bearing and rotor degradation, more power is consumed to maintain fan oscillation at the same revolutions per minute (RPM). Once the fan has exceeded a capability to compensate for wearing, the maximum revolutions per minute the fan can maintain are diminished. The illustrative method comprises measures 302 power usage of the fan. The method further comprises determining 304 a derivative of the measured fan power usage and tracking 306 the derivative over time. Impending fan failure is predicted 308 based on the tracked fan power usage derivative.

In a particular embodiment, a current sensing device is used to measure 302 the current (i) delivered to the fan. Since the fans are powered by a direct current (DC) voltage (v), the power (p) consumed by the fan is supplied according to the equation p=vi. The power consumed by the fan is a direct consequence of the work performed by the fan to sustain a set fan speed in revolutions per minute. Because the voltage (v) remains relatively constant, the current (i) is directly proportional to fan work, and accordingly increases over time as the fan wears.

Measurements of current flowing through the fan are recorded over time and the derivative of fan current usage is determined 304 and also recorded 306 over time. An increase in the derivative di/dt enables an early indication of fan wearing and is used to predict 308 imminent fan failures. An increase in the fan current derivative di/dt exceeding a predefined criterion indicates an impending fan failure and produces the indication of fan failure much sooner than can a measurement of degradation in maximum fan speed. With accelerated lifetime sensing, the current derivative (di/dt) curve can be characterized so that an accurate end-of-life prediction can be made on a fan-by-fan basis.

In a particular embodiment, the system may determine failure of a fan by analyzing a map of current behavior as a function of fan condition, actively measuring rate of current change as a function of time and comparing the measurement to a map or template. If the current change measurement enters a region on the map or template indicative of failure, the system can generate a signal indicative of fan condition. Some applications may use pattern recognition to detect discontinuities such as a stair-step function indicative of a step failure or breakage, and respond by generating a signal calling for fan replacement.

Analysis of the rate of current change rather than the absolute value of the current enables elimination of conditions such as inherent manufacturing or product variability.

Referring to FIG. 3B, a flow chart depicts another embodiment of a fan monitoring technique 310. Fan speed is measured 312 concurrently with the power usage measurements 302. Time to an impending fan failure is predicted 314 based on combined information regarding tracked fan power usage and fan speed.

Figure 4A:
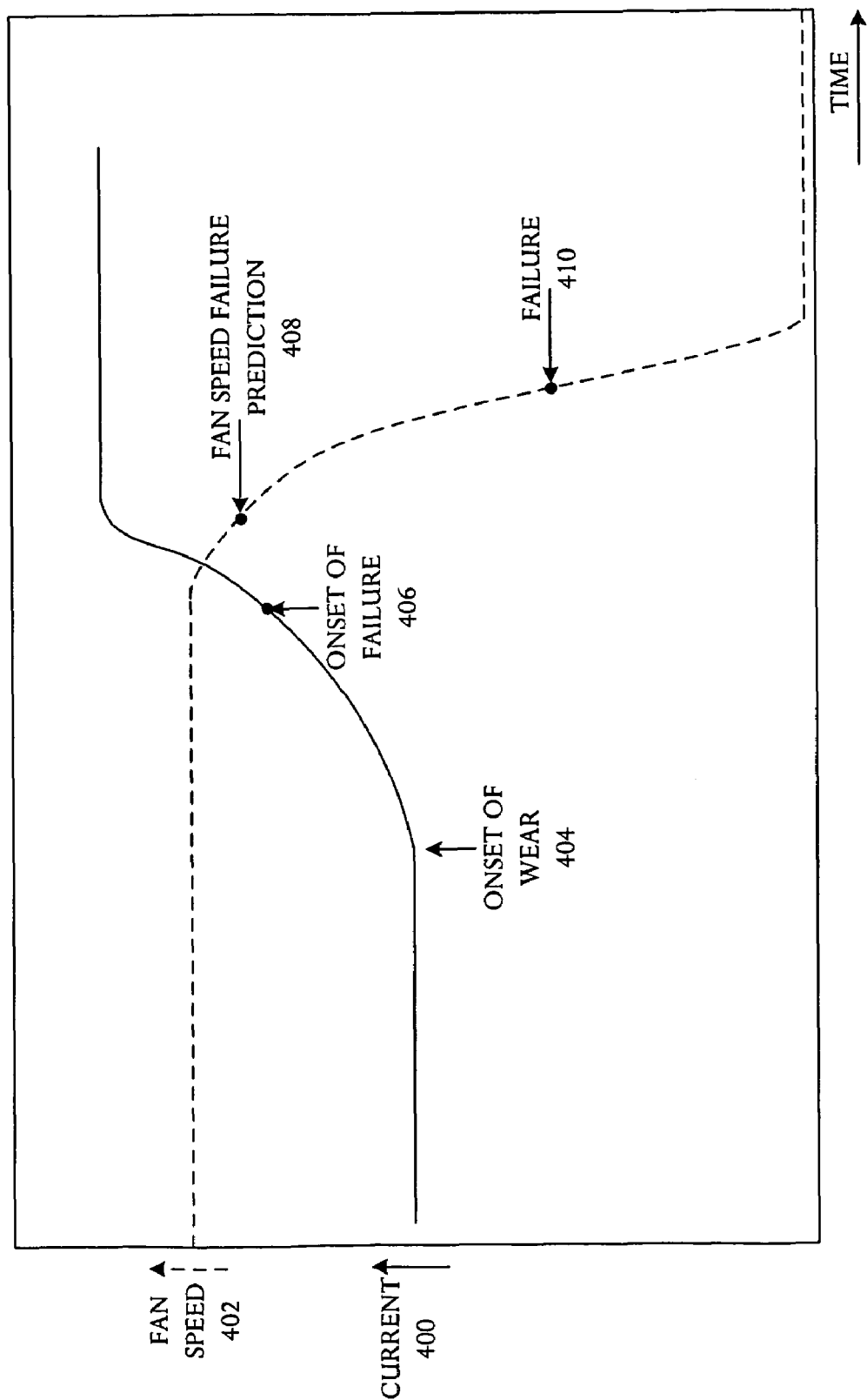
FIG. 4A is a graph showing an example of tracked data during monitoring of supply current and fan speed over time in accordance with an embodiment of a fan monitoring technique.

FIG. 4A is a graph showing monitoring of fan current consumption and fan speed over time in accordance with an embodiment of a fan monitoring technique. The x-axis shows time and the y-axis depicts both fan speed 402 and current 400 consumed by the fan. A controller can perform various types of mathematical analysis and operations, applying the measured data to a mathematical model to predict the shape of a curve over time by comparison with known information identifying the current morphology at which fan speed drops as current consumption of the fan increases. In steady-state operation with a low level of fan wear, the current consumption and fan speed are each relatively constant. As the fan begins to wear 404, fan speed does not change but the fan consumes relatively more energy to oscillate at the same speed, a degradation that continues to the onset of fan failure 406 and accelerates to complete fan failure 410. Accordingly, current usage increases over time and the shape of the current and/or current derivative waveform varies with in a predictable manner. At some time-point on the current consumption waveform, the fan speed begins to drop. In various embodiments, a mathematical model can be applied for curve fitting of the current and fan speed waveforms. In some examples, cubic spline curve fitting, exponential curve fitting, or other techniques may be applied to determine a suitable prediction function. The mathematical curve-fitting may be used to find a cross-over point of the current parameter and fan speed waveforms, thereby supplying predictive information that enables a user, service technician, or automatic functionality to respond to the condition.

In various embodiments, current measurement analysis may include tracking of the rate of current change and modeling of changes in the current parameter. Fan wearing may be modeled as an exponential change. The slope of the exponential change may be monitored. In the event the slope attains a predetermined model value, a prediction of failure is made and the expected time of failure is determined according to the exponential slope.

A monitoring system using fan speed alone to determine fan failure can only predict impending fan failure 408 after relatively severe fan degradation that causes fan slowing. Generally, fan speed monitoring involves comparing fan speed to a preset threshold. If fan speed falls below the threshold, failure is presumed, an insensitive test since fan speed may be subject to much variability. The current measurement enables a longer time period between failure prediction 406 and failure 410 in comparison to the fan speed prediction 408. Furthermore, the current measurement enables variability-tolerant monitoring accommodating short-term environmental changes, for example by continuing operation, possibly at a lower fan speed, while continuing current monitoring.

The fan current measurement may detect different modes of failure including event changes and long-term degradation. Event changes may include early breakage indicative of manufacturing, materials, assembly, or shipping difficulties, and the like. Long-term degradation typically results from material conditions such as evaporation of bearing lubricant over time that can cause the bearings to stick or seize.

Figure 4B:
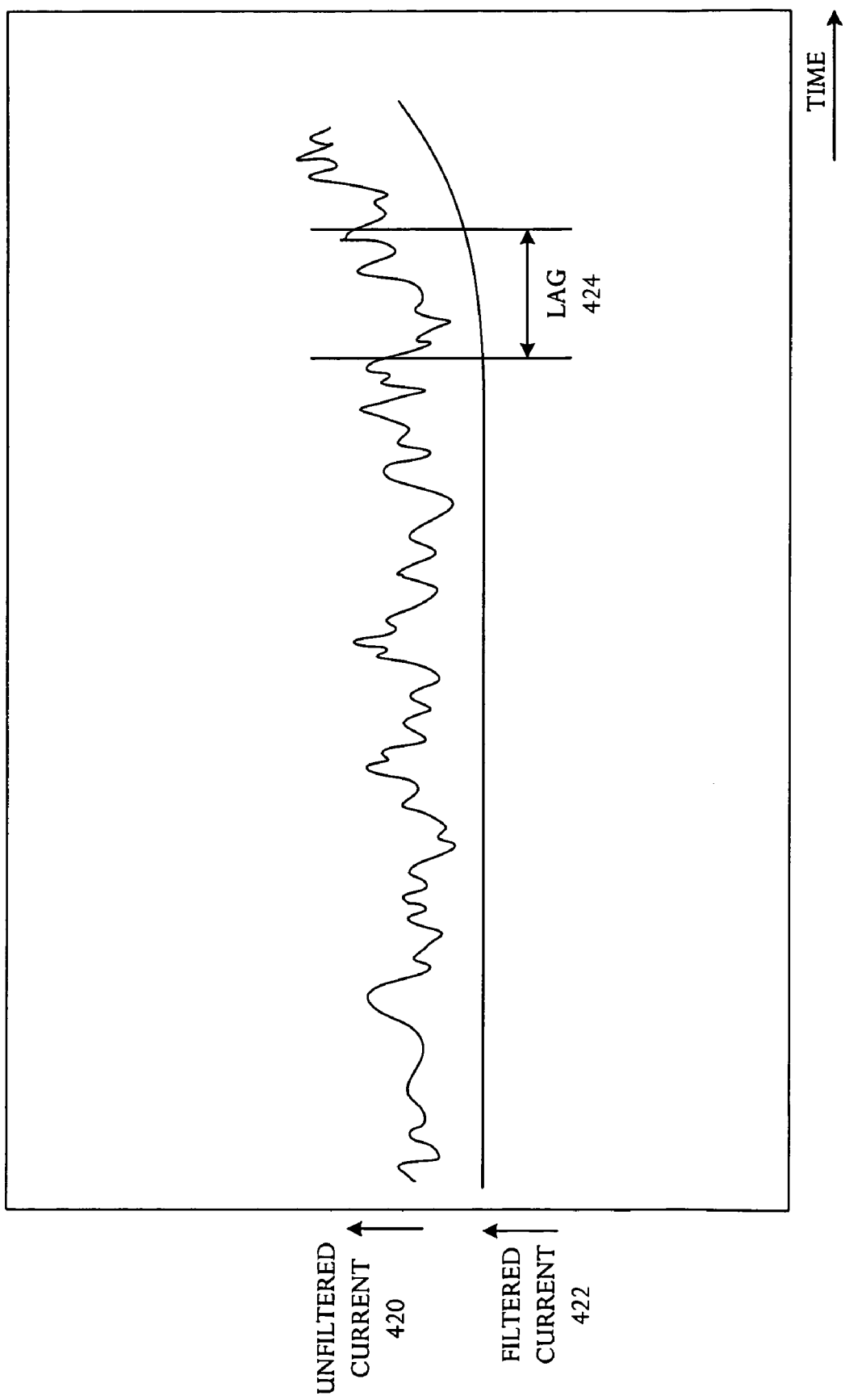
FIG. 4B is a graph of monitored data illustrating the effect of filtering the current signal.

FIG. 4B is a graph illustrating a lag 424 or delay that occurs when the current signal is filtered 422. The delay 424 slows the response. Although filtering may be either digital or analog in various embodiments, analog filtering can produce very small levels of variability, thus increasing sensitivity of fan failure prediction. The increased sensitivity is attained at the expense of the filtering lag 424. Typically, the time scale of changes is very long so that the increased sensitivity substantially outweighs the disadvantage of the relatively short lag 424.

Figure 5:
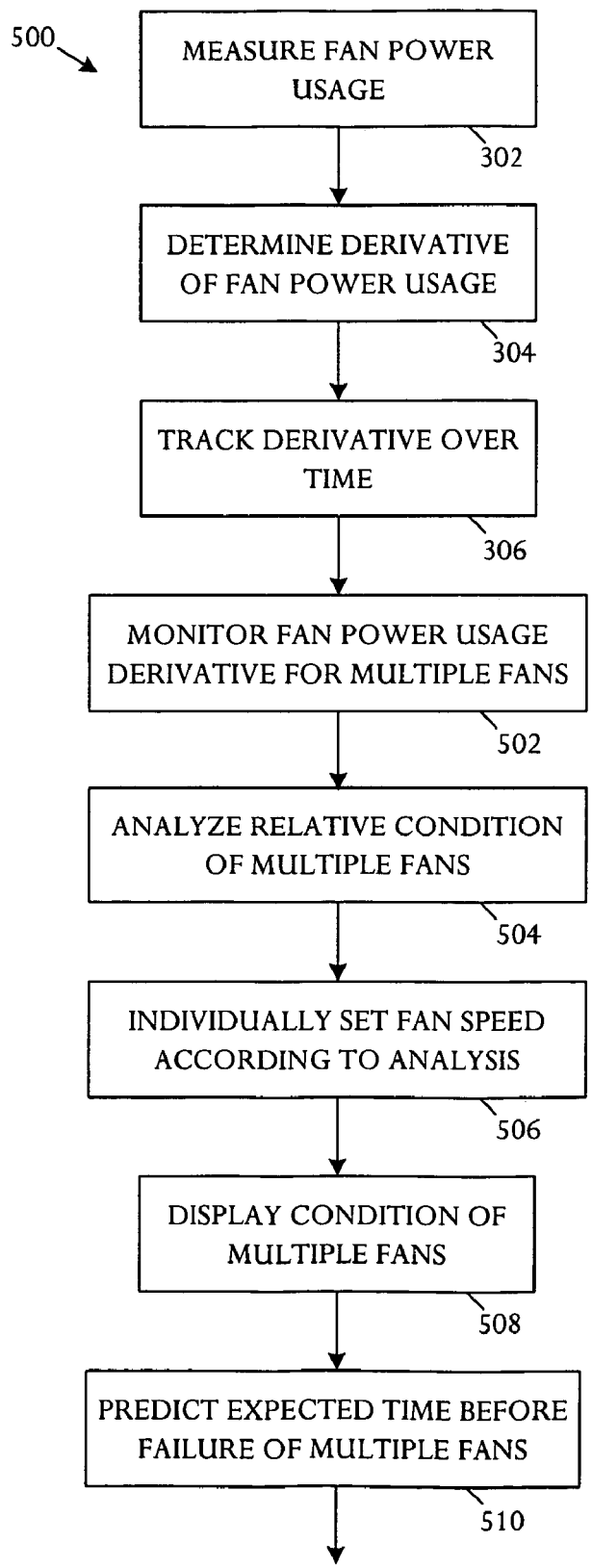
FIG. 5 is a flow chart depicting an embodiment of a fan monitoring technique for an electronic system that includes multiple fans.

Referring to FIG. 5, a flow chart depicts an embodiment of a fan monitoring technique 500 for an electronic system that includes multiple fans, for example in a redundant fan configuration. The fan power usage derivative is monitored 502 for the multiple fans and the relative condition of the fans to one another is analyzed 504. The fan speed can be set 506 selectively for the individual fans to that fans with a higher relative condition are run at a higher speed and fans with a lower relative condition are run at a lower speed.

In some embodiments, image of relative and/or absolute condition of the multiple fans is displayed 508, typically through usage of a graphical user interface (GUI) or other display.

The expected time before fan failure can be predicted 510 based on the tracked fan power usage derivative.

Figure 6A:
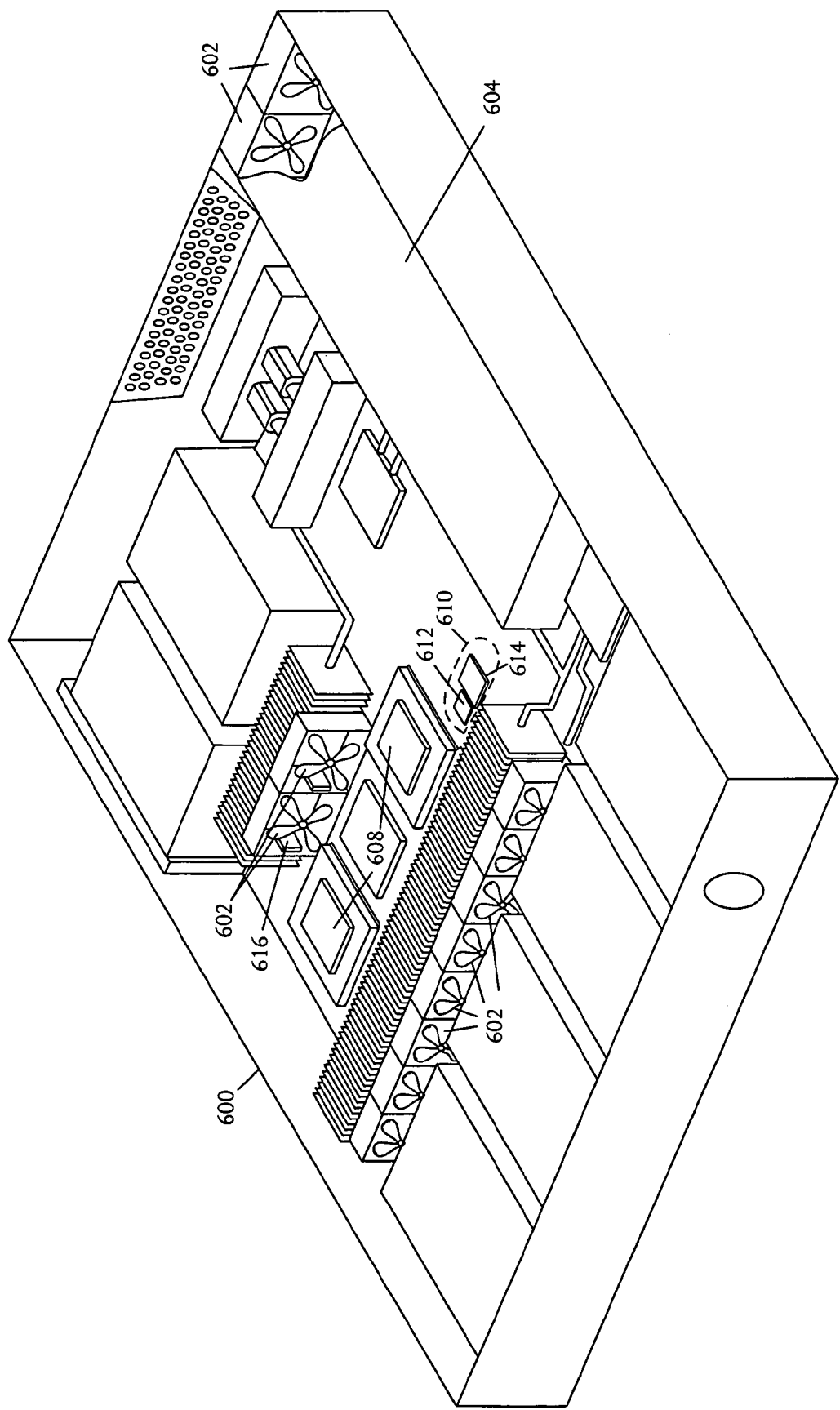
FIGS. 6A and 6B are perspective pictorial diagrams illustrating embodiments of an electronic system in a configuration that enables monitoring and analysis of one or more fans used to cool the system.
Figure 6B:
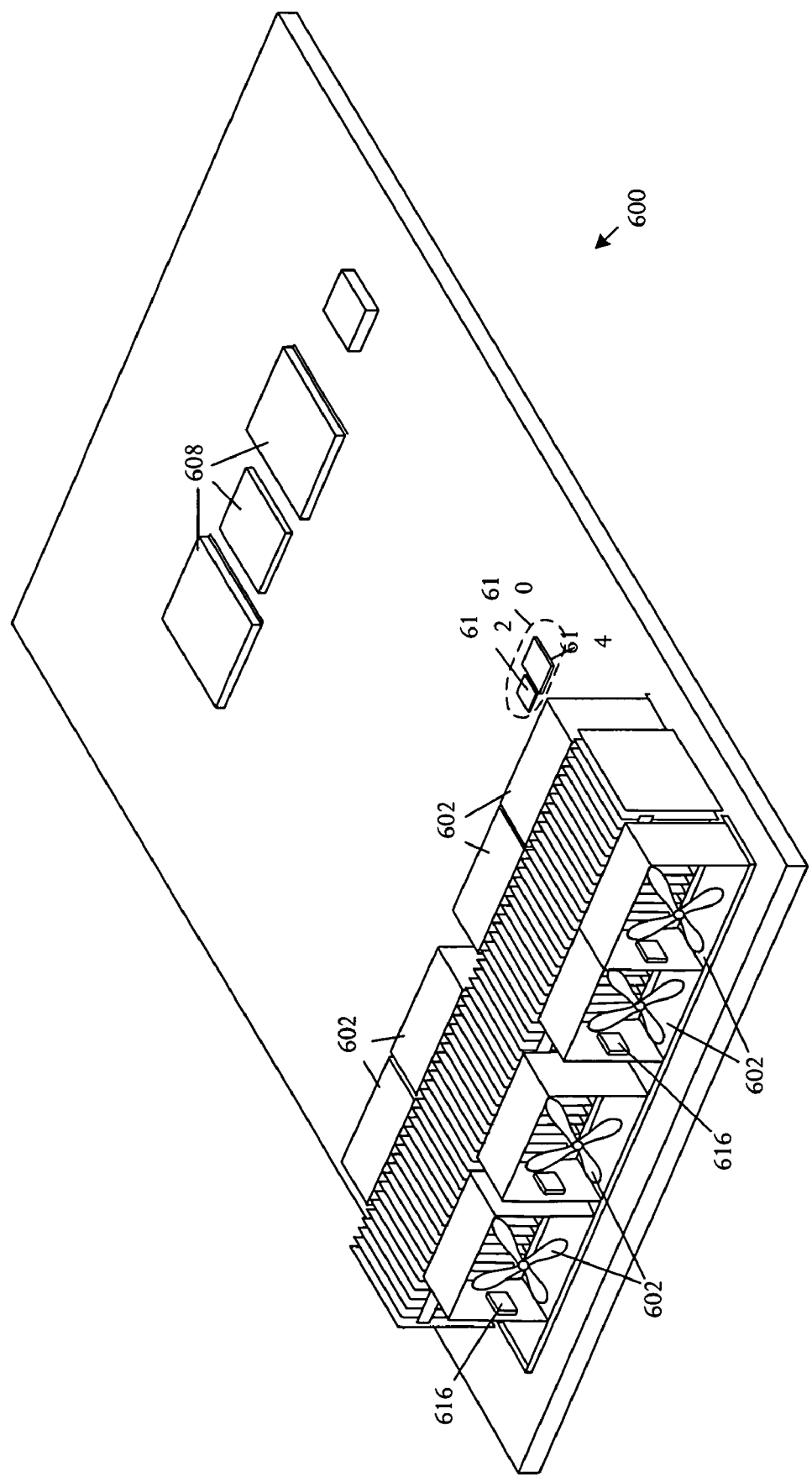

Referring to FIGS. 6A and 6B, perspective pictorial diagrams illustrate embodiments of an electronic system 600 in a configuration that enables monitoring and analysis of one or more fans 602 that are used to cool the system 600. The electronic system 600 comprises a power supply 604 and one or more fans 602, which are powered by the supply 604. The electronic system 600 further includes one or more electronic components 608, typically processors, memories, input/output interfaces, storage devices, and the like. The illustrative electronic system 600 further comprises a fan condition monitoring device 610 coupled to the fans and used to detect potential fan failure. The fan condition monitoring device 610 further comprises a power sensor 612 adapted for coupling to the fans in the electronic system 600 and measuring fan power usage. The fan condition monitoring device 610 further includes a controller 614 that is used to determine a derivative of the measured fan power usage, track the derivative over time, and predict impending fan failure based on the tracked fan power usage derivative.

The fan condition monitoring device 610 in the electronic system 600 may further comprise one for more tachometers 616 associated with or coupled to the fans and connected to the controller 614. The tachometer or tachometers 616 measure fan speed in monitoring that is concurrent with measurements of power usage by the power sensors 612. The controller 614 predicts impending fan failure based on the tracked fan power usage derivative and the fan speed in combination.

For an electronic system 600, such as the illustrated system, which includes multiple fans 602, the controller 614 monitors the tracked fan power usage derivative for the multiple fans 602 and determines the relative condition of the fans. The controller 614 may selectively set fan speed of the various fans 602 according to fan condition.

The electronic system 600 may include a user interface, such as a display screen, warning lights, generation of communication signals, and the like, to notify a user or service personnel of impending fan failure, risk of up-time degradation, or likelihood of failure information in a suitable warning time in advance of failure. The current measurement enables a user or service technician to change fans that are failing or, in a redundancy arrangement, inform of an expected time before failure.

Information acquired using the current measurement may also be used for other purposes. The current measurement gives more precise information relating to the failure rate of equipment in the field. The information may be communicated to a technical center and used for several purposes including updating the predictive model for subsequent field usage and collecting additional information relating to fan life, design reliability, cost reduction, and the like. Updating of the predictive model may be useful to adapt to different fan technology and different fan models, and to account for variability and evolution of bearings and lubricants used in the fans.

In some applications, the current sensor may be used to determine power consumption of the electronic system 600. Fan speed may be reduced if power consumption of the overall system 600 increases above a selected level. Similarly, if one or more fans become sufficiently worn that power consumption is increased above a desired level, a notification can be made to replace the worn fans, thereby reducing overall power consumption and heat generated by the system 600. Accordingly, the fan condition monitoring device 610 maybe used to modulate fan speed to extend fan life.

In electronic system arrangements implementing both current measurement and fan speed monitoring, both measurements can be used in combination to track fan performance. The current measurement has higher sensitivity than tachometer information, enabling earlier prediction.

In multiple fan-redundant fan configurations, the fan condition monitoring device 610 may be used to enable a user to eliminate redundant fans on the basis that prediction of fan failure and generation of a signal indicating fan failure at a predictable time makes fan redundancy unnecessary. Accordingly, robust prediction enables a user to save the expense and energy consumption of additional fans.

Also in multiple fan-redundant fan configurations, the fan condition monitoring device 610 may be used to operate the fans on the basis of which fans are in better condition, enabling a more robust redundancy. The age or expected life of all fans may be tracked and used as a guideline for servicing and preventive maintenance. Prediction enables usage of the best fans most productively. Fan speed may be reduced for fans in a relatively poorer condition to extend expected life.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, the illustrative structures and techniques may be used in systems with a single fan or in systems with multiple fans in any suitable redundant configuration.

What is claimed is:

1. A method for monitoring a fan in an electronic system comprising:
   measuring power usage of the fan;
   determining a derivative of the measured fan power usage;
   tracking the derivative over time; and
   predicting impending fan failure based on the tracked fan power usage derivative.

2. The method according to claim 1 further comprising:
   measuring fan current usage;
   determining a derivative of fan current usage;
   recording a fan current derivative record over time; and
   monitoring to determine an increase in fan current derivative according to a predefined criteria of impending fan failure.

3. The method according to claim 1 further comprising:
   measuring fan speed concurrently with power usage measurement; and
   predicting impending fan failure based on the tracked fan power usage derivative and the fan speed in combination.

4. The method according to claim 1 further comprising:
   monitoring the tracked fan power usage derivative for multiple fans;
   analyzing relative condition of the multiple fans; and
   selectively setting fan speed individually for ones of the multiple fans whereby relatively higher condition fans are run at higher fan speed and relatively lower condition fans are run at relatively lower fan speed.

5. The method according to claim 1 further comprising:
   monitoring the tracked fan power usage derivative for multiple fans;
   analyzing relative condition of the multiple fans; and
   displaying an image of relative and/or absolute condition of the multiple fans.

6. The method according to claim 1 further comprising:
   predicting an expected time before fan failure based on the tracked fan power usage derivative.

7. A fan condition monitoring apparatus comprising:
   a power sensor adapted for coupling to at least one fan in an electronic system and measuring fan power usage; and
   a controller coupled to the power sensor and adapted to determine a derivative of the measured fan power usage, track the derivative over time, and predict impending fan failure based in the tracked fan power usage derivative.

8. The apparatus according to claim 7 further comprising:
   the power sensor that is adapted to measure fan current usage; and
   the controller that is adapted to determine a derivative of fan current usage and record a fan current derivative record over time.

9. The apparatus according to claim 8 further comprising:
   a filter operational in combination with the controller; and
   the controller adapted to monitor to detect an increase in fan current derivative according to predefined criteria of impending fan failure.

10. The apparatus according to claim 8 further comprising:
    the controller adapted to monitor to detect an increase in fan current derivative according to a predefined threshold increase in fan current derivative indicative of impending fan failure.

11. The apparatus according to claim 8 further comprising:
    the controller adapted to monitor to detect an increase in fan current derivative according to a predefined substantially stair-step threshold increase in fan current derivative indicative of immediate impending fan failure.

12. The apparatus according to claim 7 further comprising:
    a tachometer coupled to the controller and adapted to measure fan speed concurrently with power usage measurement; and
    the controller adapted to predict impending fan failure based on the tracked fan power usage derivative and the fan speed in combination.

13. The apparatus according to claim 7 further comprising:
    a plurality of power sensors respectively coupled to a plurality of fans and adapted to measure fan power usage; and
    the controller coupled to the plurality of power sensors and adapted to monitor the tracked fan power usage derivative for multiple fans and detecting relative condition of the multiple fans.

14. The apparatus according to claim 13 further comprising:
    the controller adapted to selectively set fan speed individually for ones of the fan plurality whereby relatively higher condition fans are run at higher fan speed and relatively lower condition fans are run at relatively lower fan speed.

15. The apparatus according to claim 13 further comprising:
    the controller adapted to monitor tracked fan power usage derivative for multiple fans and detect relative condition of the multiple fans; and
    a display coupled to the controller and adapted to show an image of relative and/or absolute condition of the multiple fans.

16. The apparatus according to claim 7 further comprising:
    the controller adapted to predict an expected time before fan failure based on the tracked fan power usage derivative.

17. An electronic system comprising:
  a power supply;
  at least one fan coupled to the power supply;
  at least one electronic component coupled to the power supply; and
  a fan condition monitoring device coupled to the at least one fan and further comprising:
    a power sensor adapted for coupling to at least one fan in an electronic system and measuring fan power usage; and
    a controller coupled to the power sensor and adapted to determine a derivative of the measured fan power usage, track the derivative over time, and predict impending fan failure based on the tracked fan power usage derivative.

18. The system according to claim 17 wherein the fan condition monitoring device further comprises:
  at least one tachometer coupled to the controller and the at least one fan, the at least one tachometer adapted to measure fan speed concurrently with power usage measurement; and
  the controller adapted to predict impending fan failure based on the tracked fan power usage derivative and the fan speed in combination.

19. The system according to claim 17 wherein the fan condition monitoring device further comprising:
  a plurality of power sensors respectively coupled to a plurality of fans and adapted to measure fan power usage; and
  the controller coupled to the plurality of power sensors and adapted to monitor the tracked fan power usage derivative for multiple fans and determining relative condition of the multiple fans.

20. The system according to claim 19 wherein the fan condition monitoring device further comprising:
  the controller adapted to selectively set fan speed individually for ones of the fan plurality whereby relatively higher condition fans are run at higher fan speed and relatively lower condition fans are run at relatively lower fan speed.

21. The system according to claim 19 wherein the fan condition monitoring device further comprising:
  the controller adapted to monitor tracked fan power usage derivative for multiple fans and detect relative condition of the multiple fans; and
  a display coupled to the controller and adapted to show an image of relative and/or absolute condition of the multiple fans.

22. The system according to claim 17 wherein the fan condition monitoring device further comprising:
  the controller adapted to monitor tracked fan power usage derivative for multiple fans and detect power consumption of the multiple fans and generate a signal indicative of the power consumption.

* * * * *

UNITED STATES PATENT AND TRADEMARK OFFICE
CERTIFICATE OF CORRECTION

PATENT NO. : 7,142,125 B2  Page 1 of 1
APPLICATION NO. : 11/042910
DATED : November 28, 2006
INVENTOR(S) : Thane M. Larson et al.

It is certified that error appears in the above-identified patent and that said Letters Patent is hereby corrected as shown below:

In column 8, line 4, in Claim 7, delete "in" and insert -- on --, therefor.

Signed and Sealed this

Twenty-second Day of December, 2009

David J. Kappos
*Director of the United States Patent and Trademark Office*